United States Patent [19]
Butler

[11] Patent Number: 5,091,701
[45] Date of Patent: Feb. 25, 1992

[54] HIGH EFFICIENCY CROSS-COUPLED FOLDED CASCODE CIRCUIT

[75] Inventor: James R. Butler, San Jose, Calif.

[73] Assignee: Analog Devices, Inc., Norwood, Mass.

[21] Appl. No.: 597,795

[22] Filed: Oct. 15, 1990

[51] Int. Cl.[5] .............................................. H03F 3/45
[52] U.S. Cl. .................................... 330/252; 330/257
[58] Field of Search ............... 330/252, 255, 257, 261, 330/296, 300, 311

[56] References Cited

U.S. PATENT DOCUMENTS 4,959,622  9/1990  Kearney ............................. 330/257

*Primary Examiner*—Steven Mottola
*Attorney, Agent, or Firm*—Koppel & Jacobs

[57] ABSTRACT

A differential input circuit has an input stage with a pair of differentially biased input transistors connected to supply current through respective load impedances, and a gain stage with a second pair of transistors connected to supply additional currents to the load impedances to keep the impedance currents constant over variations in the input voltage levels. A cross-coupled cascode circuit connected between the gain stage transistors and the load impedances compensates for inaccuracies in the load impedance currents which occur during dynamic operation of the circuit, and thus enhances gain, linearity and the current transfer efficiency between the two stages.

5 Claims, 2 Drawing Sheets

HIGH EFFICIENCY CROSS-COUPLED FOLDED CASCODE CIRCUIT

BACKGROUND OF THE INVENTION

1. Field of the Invention

This invention is for an electrical circuit that provides voltage gain by means of a differential current transfer.

2. Description of the Related Art

Voltage gain stages have been developed whose operation includes a differential current transfer. Such circuits are useful in operational amplifiers, comparators and other circuits in which a voltage level shifting function is accomplished by means of a differential current transfer.

A known circuit that performs this function is shown in FIG. 1. A differential input voltage $V_{in}$ is applied across the bases of a pair of input bipolar transistors Q1 and Q2. The transistors are illustrated as pnp devices, but the circuit can also be implemented with npn transistors. A current source I1 is connected to a positive voltage bus V+ and provides a current that is divided between the two transistors Q1, Q2 in accordance with the input voltage differential. The collectors of Q1 and Q2 are connected to a negative voltage bus V− through load resistors R1 and R2, respectively. The difference in the current magnitude supplied by Q1 and Q2 to their respective load resistors is the differential current output of the first stage. The circuit is designed to use this differential current in a second stage to produce an overall voltage gain.

The second stage is shown immediately to the right of Q2. It includes a Wilson current mirror, shown enclosed in dashed line 2, which supplies a pair of mirrored currents to bipolar transistors Q3 and Q4. The collector-emitter circuits of Q3 and Q4 are connected to supply current to R1 and R2, respectively. A common base bias is establish for Q3 and Q4 by a bias circuit consisting of current source I2, diode-connected transistor Q5 and resistor R3, all of which are connected in series between V+ and V−. The base of Q5 is connected in common with the bases of Q3 and Q4, so that the base bias voltage for the latter two transistors is equal to the sum of the base-emitter voltage across Q5 and the voltage across R3. I2 and R3 are selected so that the voltage across R3 is ideally equal to the voltages across R1 and R2.

The second stage output is taken from the collector of Q4 along line 4. An output stage is provided consisting of bipolar transistors Q6 and Q7 and resistor R4, all connected in series between V+ and V−. Output line 4 from the second stage is connected to the base of Q6, while the base of Q7 is biased in common with Q3, Q4 and Q5. The final circuit output $V_o$ is taken from the connection between the emitter of Q6 and the collector of Q7, both of which are illustrated as npn transistors.

In the ideal operation of this circuit, the difference in current flowing through Q3 and Q4 is equal to the difference in current flowing through Q2 and Q1, so that the total current flowing through R1 (the sum of the currents from Q1 and Q3) equals the total current flowing through R2 (the sum of the currents from Q2 and Q4). R1 and R2 would normally be equal value impedances, so that the voltages across R1 and R2 would ideally be equal.

The circuit of FIG. 1 suffers from an inaccuracy in the current transfer under dynamic input conditions. Assume first that the circuit is balanced, with the total current through R1 (supplied by Q1 and Q3) equal to the total current through R2 (supplied by Q2 and Q4). Then assume that the relative input voltage to Q1 goes down, resulting in a shift in the current supplied by source I1 away from Q1 and towards Q2. As a result, the current through Q3 increases and the current through Q4 decreases so that the total currents through R1 and R2, and the voltage drops across these resistors, attempt to remain constant. However, as the collector-emitter currents through Q3 and Q4 change, the base-emitter voltages of these transistors will also vary, since they are operating unsaturated. As a result, the currents from Q3 and Q4 will depart from their desired values, the currents through R1 and R2 will not be equal, and the current transfer from the first to the second stage will not be 100%.

The present invention seeks to improve the dynamic current transfer operation of the FIG. 1 circuit. There is another prior circuit, shown in FIG. 2, that is relevant to the invention. The FIG. 2 circuit, however, is for steady state operation and serves an entirely different function. The circuit is a dual output current source, in which dual output currents are supplied to load resistors R5 and R6 by current source bipolar transistors Q8 and Q9, respectively. A bias circuit for Q8 and Q9 is formed by a circuit consisting of current source I3, diode-connected transistors Q10 and Q11, and resistor R7, all connected in series between positive and negative buses V+ and V−. Q8 and Q9 have a common base connection with Q10, and therefore are proportionately mirror the current transmitted through Q10 from I3. The emitters of npn devices Q8 and Q9 are connected through resistors R8 and R9 to V− by a cross-coupled cascode circuit consisting of npn transistors Q12 and Q13, with the collector-emitter circuit of Q12 connected between the emitter of Q8 and R8, and the collector-emitter circuit of Q13 connected between the emitter of Q9 and R9. Q12 and Q13 are cross-coupled by connecting the base of each to the collector of the other.

Without the Q12/Q13 circuit, it is necessary to adjust both the sizes of R8 and R9 and the emitter areas of Q8 and Q9 to adjust the output currents through R5 and R6. The addition of cross-coupled transistors Q12 and Q13 eliminates the need to adjust the emitter areas of Q8 and Q9, keeping the ratio of the output currents through R5 and R6 in a substantially constant proportion to the R9/R8 ratio. Changes in the relative steady state output currents can be made by changing the values of R8 and/or R9, without modifying the emitter areas of Q8 and Q9. This circuit is not designed, however, for a dynamic mode in which the ratio of the output current through R5 and R6 is continually changing. Rather, once the output current ratio is set it remains fixed, and will not change unless the resistors R8 and/or R9 are modified.

SUMMARY OF THE INVENTION

The present invention significantly improves the current transfer efficiency of the FIG. 1 circuit, and also increases its gain, by providing a cross-coupled cascode circuit between the second stage gain transistors and the output impedances of the input stage. The collector-emitter circuits and bases of the additional transistors are cross-coupled to resist changes in the total currents supplied to the input stage load impedances when current shifts from one input transistor to the other. The additional transistors are responsive to changes in the bias voltages across output transistors which result from changes in the currents flowing through the input transistors, and adjust the current flows from the gain stage to the input stage load impedances to maintain the total currents through the load impedances substantially constant. By thus making the currents through the load impedances independent of changes in the bias voltages across the gain stage transistors, both current transfer efficiency between the two stages and gain is improved. A bias circuit for the two gain stage transistors keeps their base voltages at approximately two base-emitter voltage drops above the voltage across the load impedances.

These and other features and advantages of the invention will be apparent to those skilled in the art from the following detailed description of a preferred embodiment, taken together with the accompanying drawings, in which:

DETAILED DESCRIPTION OF A PREFERRED EMBODIMENT

Figure 1:
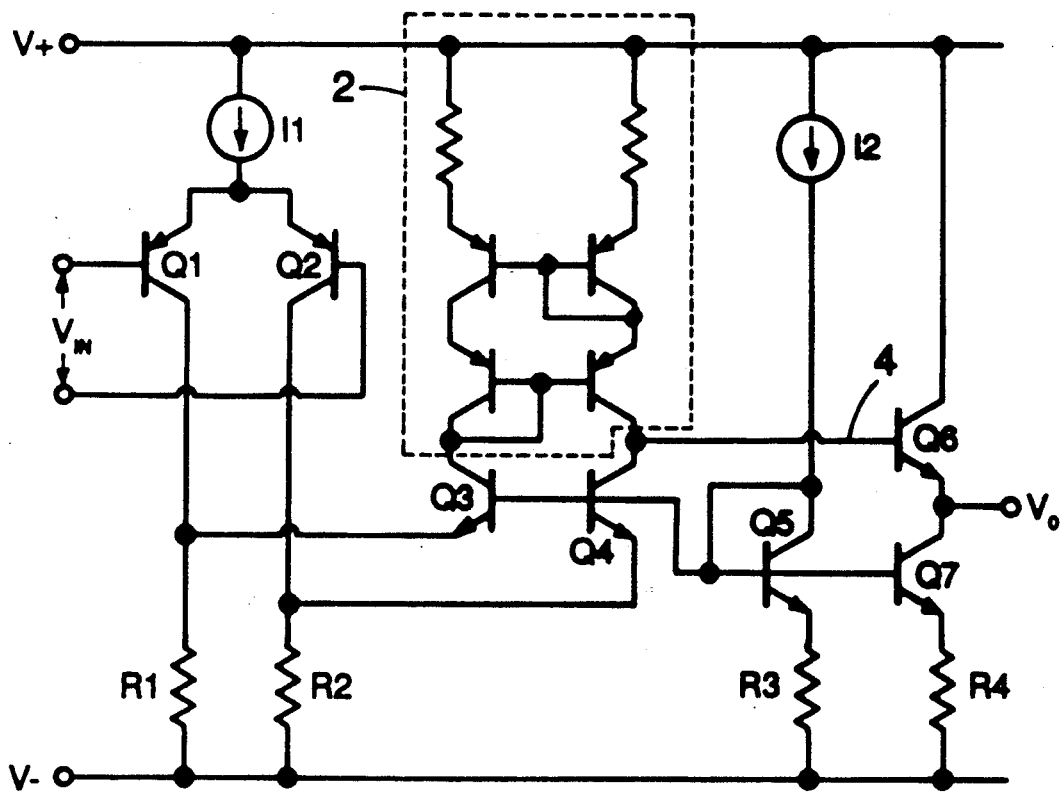
FIG. 1 is a circuit diagram of a prior differential input voltage gain circuit, discussed above.
Figure 2:
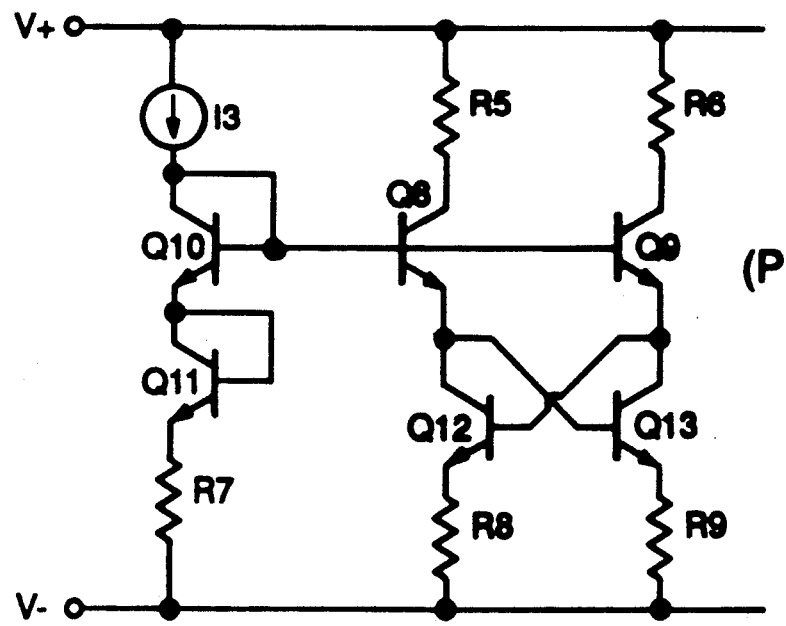
FIG. 2 is a circuit diagram of a prior dual output current source, discussed above.

The present invention improves upon the circuit of FIG. 1 to provide a more efficient and accurate differential current transfer between the input and gain stages. A preferred implementation of the invention is shown in FIG. 3, in which elements common to those in the FIG. 1 circuit are indicated by the same reference numerals.

Figure 3:
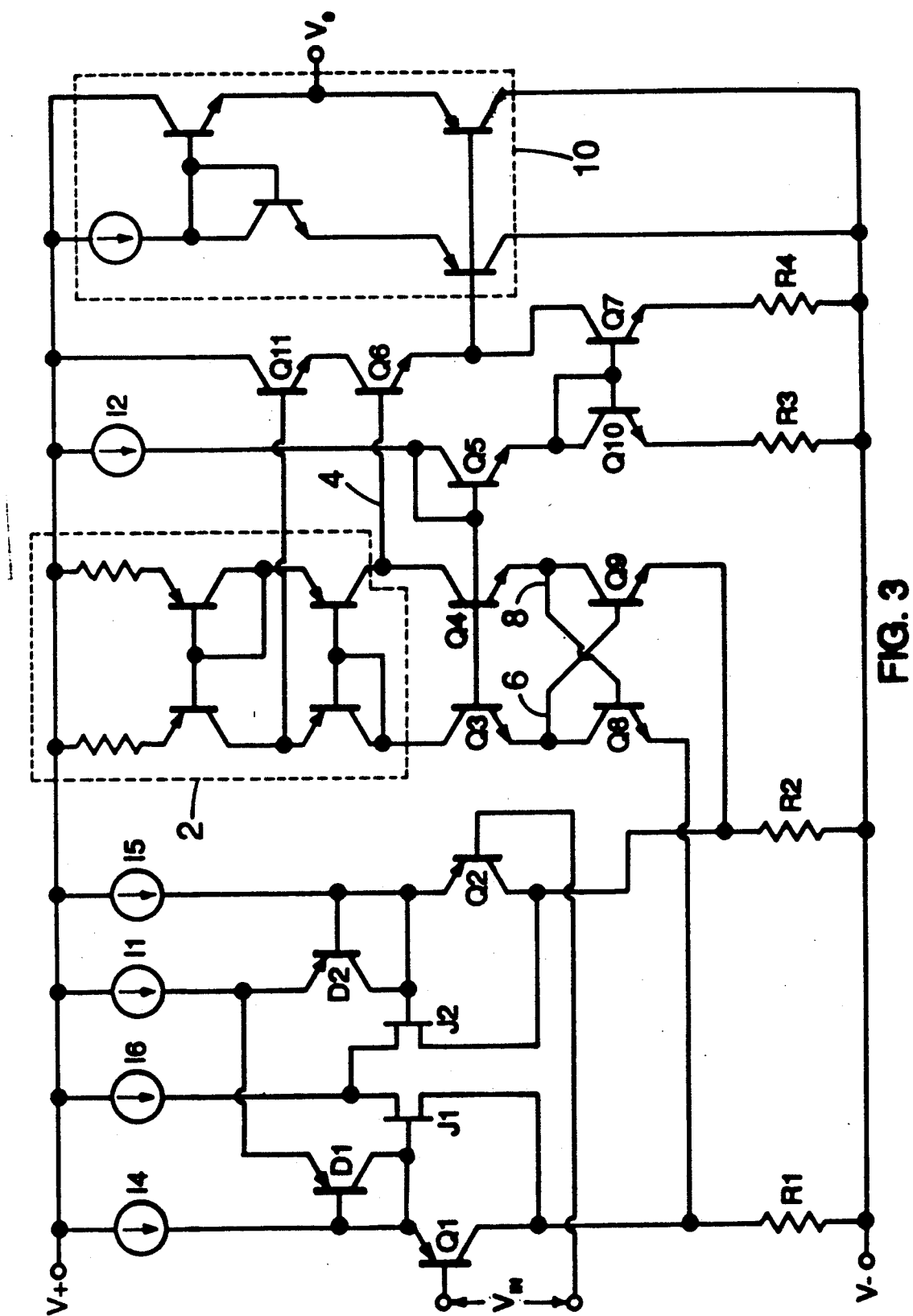
FIG. 3 is a circuit diagram of a preferred embodiment of the invention.

The input stage of FIG. 3 has been modified from that shown in FIG. 1 to enhance its overall bandwidth, its transconductance $g_m$, its noise characteristics and its input voltage range. This modification is not the basis of the present invention, but is described here as the best mode. The modification involves the addition of current sources I4 and I5 to supply current to the collector-emitter circuits of Q1 and Q2, respectively. Additional circuit paths between the positive voltage bus and resistors R1, R2 are provided by field effect transistors (FETs) J1, J2, which can be implemented as either junction FETs (JFETs) or metal-oxide-semiconductor FETs (MOSFETs). The source-drain circuits of J1 and J2 are supplied with current by a current source I6 tied to positive bus V+, with the opposite sides of the J1, J2 source-drain circuits connected respectively to the common connections for Q1/R1 and Q2/R2. Finally, a pair of impedances in the form of diode-connected bipolar transistors D1, D2 are connected to divide the current from current source I1 between the emitter-collector circuits of Q1 and Q2, respectively. The gates of J1 and J2 are connected in common with D1 and D2 to the emitters of Q1 and Q2, respectively.

With the described input stage, the $g_m$ of bipolar transistors Q1, Q2 will dominate over the $g_m$ of FETs J1, J2 for small signal inputs on the order of 0.1 volts or less, in establishing the transconductance of the overall stage.

For larger input voltage differentials on the order of about 0.1–1 volt, the $g_m$ for the input stage is governed by J1 and J2. The input stage thus combines the superior $g_m$, frequency response, bandwith and background noise of bipolar transistors Q1, Q2 for relatively low input voltage differentials up to about 0.1 volt (above which Q1 and Q2 saturate), with the higher slew rate of the JFET circuit for higher input voltage differentials up to about 1 volt. This type of transconductance stage is described in further detail in U.S. patent application Ser. No. 07/597,794 by James R. Butler and Douglas S. Smith, "Wide Dynamic Range Transconductance Stage", and assigned to Precision Monolithics, Inc., the assignee of the present invention. While the input stage could be implemented as shown in FIG. 1, the FIG. 3 input stage is preferred.

The gain stage of FIG. 3 has been modified by the addition of a cross-coupled folded cascode circuit between Q3, Q4 and the load impedances R1, R2. In the illustrated circuit in which npn transistors are used for Q3 and Q4, the cascode circuit consists of npn bipolar transistors Q8 and Q9. The collectors of Q8 and Q9 are connected respectively to the emitters of Q3 and Q4, the emitters of Q8 and Q9 are connected respectively to R1 and R2, and their bases are cross-coupled with their collectors by leads 6 and 8.

In the bias circuit for the gain stage, an additional diode-connected bipolar transistor Q10 has been added in series between Q5 and R3 to compensate for the additional base-emitter voltage drops introduced by Q8 and Q9. The base of Q10 (rather than the base of Q5 as in FIG. 1) is connected in common with the base of Q7 in the output stage. An additional transistor Q11 is connected between V+ and Q6 in the output stage to compensate for the base current of Q6, and thus provide a very high input impedance at the output of the second stage. In addition, a voltage buffer, current gain output stage shown enclosed in dashed line 10 is connected to the output taken between Q6 and Q7 to provide a buffer and further current gain.

The operation of the FIG. 3 circuitry will now be described. Assume first that the input voltage to Q2 has decreased relative to Q1, and that current has accordingly shifted from Q1 to Q2. As a result, the current through Q3 will increase in an attempt to compensate for the reduction in current through Q1, to maintain a constant current through R1. The current through Q4 will attempt to drop by a corresponding amount to compensate for the increase in current through Q2, and to maintain the total current through R2 constant. Because of the increase in the Q3 current, its base-emitter voltage drop will increase, lowering its emitter voltage. Conversely, the base-emitter voltage drop of Q4 will go down because of its reduced current, increasing the emitter voltage of Q4. The reduced emitter voltage for Q3 appears as a reduced base voltage for Q9, while the increase emitter-voltage for Q4 appears as an increased base voltage for Q8 by the cross-coupled cascode connection for Q8 and Q9. As a result, the reduction in the Q8 collector voltage (equal to the Q3 emitter voltage) is balanced by an increase in the Q8 base voltage, and the increase in the Q9 collector voltage (equal to the Q4 emitter voltage) is balanced by a reduction in the Q9 base voltage. Another way of looking at this operation is to visualize the base of Q9 absorbing the excess current increase from Q3, and the base of Q8 supplying the excess current reduction for Q4. With either analysis, the result is constant total load currents (to a first order approximation) through load resistors R1 and R2.

The maintenance of a substantially constant differential load current in the input stage enhances the current transfer efficiency between the input and gain stages, and is calculated to increase gain by about 13 db. An improvement in the linearity of the circuit operation is also anticipated, because the non-linear base-emitter voltage characteristics of Q3 and Q4 are approximately cancelled by the addition of the cross-coupled cascode circuit.

While a preferred embodiment of the invention has been shown and described, numerous variations and alternate embodiments will occur to those skilled in the art. For example, the conductivities of the input and gain transistors could be reversed from npn to pnp, with corresponding adjustments made to the circuit topology. Accordingly, it is intended that the invention be limited only in terms of the appended claims.

I claim:

1. A differential input circuit having:
 a first stage comprising:
  first and second current branches,
  respective load impedance in each branch, and
  means for dividing a stage current between said first and second branches and their respective load impedances in accordance with a differential input voltage signal applied across the two branches, and
 a second stage comprising:
  first and second transistors connected to supply respective currents to said load impedances to compensate for changes in the branch currents, and
  bias circuit means for said transistors,
 wherein the improvement comprises:
  third and fourth transistors connected to couple the currents from said first and second transistors to the load impedances for said first and second branches, respectively, and circuit means cross-coupling said third and fourth transistors, said cross-coupled third and fourth transistors together with said cross-coupling circuit means compensating for current-induced changes in the voltages across said first and second transistors to maintain the aggregate voltages across said first and third transistors and across said second and fourth transistors approximately constant, and thereby adjust the currents flowing from said second stage to said load impedances to maintain the total currents through said load impedances approximately constant, and approximately independent of said changes in the voltage across said first and second transistors.

2. A differential input circuit having:
 a first stage comprising:
  first and second current branches,
  respective load impedances in each branch, and
  means for dividing a stage current between said first and second branches and their respective load impedances in accordance with a differential input voltage signal applied across the two branches, and
 a second stage comprising:
  first and second transistors connected to supply respective currents to said load impedances to compensate for changes in the branch currents, and
  bias circuit means for said transistors,
 wherein the improvement comprises:
  third and fourth transistors connected to couple the currents from said first and second transistors to the load impedances for said first and second branches, respectively, and circuit means cross-coupling said third and fourth transistors to be respective to changes in the voltages across said first and second transistors resulting from changes in their currents, said cross-coupled third and fourth transistors adjusting the currents flowing from said second stage to said load impedances so as to maintain the total currents through said load impedances substantially constant, and substantially independent of said changes in the voltages across said first and second transistors,
  said first, second, third and fourth transistors comprising bipolar transistors, the collector-emitter circuits of the first and third transistors and of the second and fourth transistors being connected in series, wherein said cross-coupling circuit means comprises means connecting the collectors of the third and fourth transistors with each other's bases.

3. The circuit of claim 2, said bias circuit means setting the base voltages of said first and second transistors at a common level approximately two base-emitter voltage drops above the voltage across said load impedances.

4. A differential input voltage gain circuit having:
 a first stage comprising:
  first and second bipolar input transistors having respective collector-emitter circuits,
  a current source connected to divide its current between said collector-emitter circuits of said input transistors in accordance with a differential input voltage signal applied across the bases of said transistors, and
  first and second load impedances connected to receive the currents from said first and second input transistors, respectively, and
 a second stage comprising:
  first and second bipolar gain transistors connected to supply currents to said first and second load impedances, respectively, to compensate for changes in the currents through said first and second input transistors by resisting changes in the currents through said load resistors,
 wherein the improvement comprises:
  third and fourth bipolar gain transistors connected in cascode circuit respectively with said first and second bipolar gain transistors to couple current from said transistors respectively to said first and second load impedances, the collector-emitter circuits and bases of said third and fourth bipolar gain transistors being cross-coupled to resist changes in the total currents supplied to said load impedances when the currents supplied to said load impedances by said input transistors vary.

5. The circuit of claim 4, further comprising a common bias circuit connected to the bases of said first and second bipolar gain transistors, said bias circuit comprising a current source connected in series with the collector-emitter circuits of a pair of diode-connected bipolar transistors and an impedance, the magnitudes of said current source and impedance being selected to produce a base bias voltage for said first and second bipolar gain transistors that is approximately two base-emitter voltage drops above the voltage across said load impedances.

* * * * *